United States Patent
Kitani et al.

(10) Patent No.: US 9,184,306 B2
(45) Date of Patent: Nov. 10, 2015

(54) SILICON CARBIDE SEMICONDUCTOR DEVICE

(71) Applicant: MITSUBISHI ELECTRIC CORPORATION, Tokyo (JP)

(72) Inventors: Takeshi Kitani, Tokyo (JP); Yoichiro Tarui, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 100 days.

(21) Appl. No.: 13/931,203

(22) Filed: Jun. 28, 2013

(65) Prior Publication Data

US 2014/0077226 A1  Mar. 20, 2014

(30) Foreign Application Priority Data

Sep. 14, 2012  (JP) ................... 2012-202468

(51) Int. Cl.
| | |
|---|---|
| *H01L 29/15* | (2006.01) |
| *H01L 31/0312* | (2006.01) |
| *H01L 29/872* | (2006.01) |
| *H01L 29/36* | (2006.01) |
| *H01L 29/16* | (2006.01) |
| *H01L 29/06* | (2006.01) |

(52) U.S. Cl.
CPC .......... *H01L 29/872* (2013.01); *H01L 29/0619* (2013.01); *H01L 29/36* (2013.01); *H01L 29/0692* (2013.01); *H01L 29/1608* (2013.01)

(58) Field of Classification Search
None
See application file for complete search history.

(56) References Cited

U.S. PATENT DOCUMENTS

| | | | | |
|---|---|---|---|---|
| 5,902,117 | A | * | 5/1999 | Rottner et al. ................ 438/105 |
| 7,728,402 | B2 | | 6/2010 | Zhang et al. |
| 7,772,058 | B2 | * | 8/2010 | Tanimoto ..................... 438/197 |
| 7,816,733 | B2 | | 10/2010 | Okuno et al. |

(Continued)

FOREIGN PATENT DOCUMENTS

| | | |
|---|---|---|
| DE | 102008021430 A1 | 11/2008 |
| JP | 2008-042198 A | 2/2008 |

(Continued)

OTHER PUBLICATIONS

An Office Action; "Notice of Preliminary Rejection," issued by the Korean Patent Office on Nov. 13, 2014, which corresponds to Korean Patent Application No. 10-2013-0106390 and is related to U.S. Appl. No. 13/931,203; with English language translation.

(Continued)

*Primary Examiner* — Sonya D McCall Shepard
(74) *Attorney, Agent, or Firm* — Studebaker & Brackett PC

(57) ABSTRACT

A silicon carbide semiconductor device of the present invention comprises a silicon carbide drift layer formed on a silicon carbide substrate, a P-type region formed in a surface layer of the silicon carbide drift layer, and a Schottky electrode formed above the silicon carbide drift layer correspondingly to a forming portion of the P-type region. The P-type region is formed of a plurality of unit cells arranged therein. Each of the unit cells has at least a first distribution region in which the P-type impurity is distributed at first concentration and a second distribution region in which the P-type impurity is distributed at second concentration higher than the first concentration. With this structure, it is possible to provide a silicon carbide semiconductor device in which a sufficient breakdown voltage can be achieved with less number of ion implantations.

11 Claims, 15 Drawing Sheets

(56) References Cited

U.S. PATENT DOCUMENTS

| | | |
|---|---|---|
| 7,838,888 B2 | 11/2010 | Yamamoto et al. |
| 7,893,467 B2 | 2/2011 | Yamamoto et al. |
| 8,232,558 B2 | 7/2012 | Zhang et al. |
| 8,330,244 B2 | 12/2012 | Zhang et al. |
| 2008/0277668 A1 | 11/2008 | Okuno et al. |
| 2011/0248285 A1* | 10/2011 | Zhang et al. ............... 257/77 |
| 2012/0273802 A1 | 11/2012 | Zhang et al. |
| 2013/0221477 A1 | 8/2013 | Watanabe et al. |

FOREIGN PATENT DOCUMENTS

| | | | |
|---|---|---|---|
| JP | 2008-270413 A | 11/2008 | |
| JP | 2008-282973 A | 11/2008 | |
| JP | 2008-300506 A | 12/2008 | |
| JP | 2010-003841 A | 1/2010 | |
| JP | 2011-521471 A | 7/2011 | |
| WO | 2009/142721 A1 | 11/2009 | |
| WO | 2012/090861 A1 | 7/2012 | |

OTHER PUBLICATIONS

The second Office Action issued by the Korean Patent Office on May 28, 2015, which corresponds to Korean Patent Application No. 10-2013-0106390 and is related to U.S. Appl. No. 13/931,203; with English language translation.

An Office Action issued by the German Patent Office on May 19, 2015, which corresponds to German Patent Application No. 10 2013 217 850.6 and is related to U.S. Appl. No. 13/931,203; with English language translation.

* cited by examiner

SILICON CARBIDE SEMICONDUCTOR DEVICE

BACKGROUND OF THE INVENTION

1. Field of the Invention

The present invention relates to a silicon carbide semiconductor device, and more particularly to a JBS (Junction Barrier controlled Schottky diode) or an MPS (Merged P-i-N/Schottky diode) which uses silicon carbide.

2. Description of the Background Art

The dielectric breakdown electric field of silicon carbide is about ten times as large as that of silicon and the band gap of silicon carbide is about three times as wide as that of silicon. Therefore, a power device using silicon carbide has a characteristic feature that allows a high temperature operation with low resistance as compared with a currently-used power device using silicon.

Particularly, an SBD (Schottky Barrier Diode) and a MOS-FET (Metal-Oxide-Semiconductor Field-Effect Transistor) which use silicon carbide can reduce a loss in an operation as compared at the same breakdown voltage with a pn diode and an IGBT (Insulated Gate Bipolar Transistor) which use silicon. The Schottky barrier diode (SBD), especially, has a simple device structure, and development thereof for practical use has been actively made.

The Schottky barrier diode (SBD) has problems of an increase in the leak current in application of reverse bias and an increase in a loss in energization in a case where it is intended to achieve high breakdown voltage. As a countermeasure against these problems, proposed are a JBS, an MPS, and the like structures. The JBS is a structure in which an N-type epitaxial layer is formed on an $N^+$, -type silicon carbide substrate and a Schottky electrode is formed in a front surface of the $N^-$, -type epitaxial layer and an ohmic electrode is formed on a back surface of the $N^+$, -type silicon carbide substrate. A P-type end region for relieving an electric field is provided at an end portion of the Schottky electrode and a P-type region is provided below the Schottky electrode.

In any structure, a P-type region is formed below the Schottky electrode, at the end portion of the Schottky electrode, and at a peripheral portion thereof.

In techniques disclosed, for example, in Japanese Patent Application Laid Open Gazette Nos. 2008-282973, and 2008-300506,, P-type regions of different depths and P-type regions of different sizes are formed below the Schottky electrode.

Further, in techniques disclosed in Japanese Patent Application Laid Open Gazette Nos. 2008-270413, and 2011-521471,, P-i-N regions are arranged in a unit of chip. In a technique disclosed in Japanese Patent Application Laid Open Gazette No. 2008-042198,, P-type regions of two kinds of concentrations are arranged in a unit of chip.

For achieving the above structures, however, in order to form the P-type regions of different conditions, ion implantation has to be performed the number of times that satisfies the different conditions. Therefore, there arises a problem of an increase in the number of ion implantation processes.

Further, since the P-type regions are locally formed, surge current is concentrated and this arises a problem that high breakdown voltage cannot be achieved.

SUMMARY OF THE INVENTION

It is an object of the present invention to provide a silicon carbide semiconductor device in which a sufficient breakdown voltage can be achieved with less number of ion implantations.

The present invention is intended for a silicon carbide semiconductor device. According to an aspect of the present invention, the silicon carbide semiconductor device includes a silicon carbide drift layer of a first conductivity type formed on a silicon carbide substrate of the first conductivity type, a second conductivity type region formed in a surface layer of the silicon carbide drift layer, and a Schottky electrode formed above the silicon carbide drift layer correspondingly to a forming portion of the second conductivity type region. In the silicon carbide semiconductor device of the present invention, the second conductivity type region is formed of a plurality of unit cells arranged therein, each of which is a repeating unit of a distribution of a second conductivity type impurity. Each of the plurality of unit cells has at least a first distribution region in which the second conductivity type impurity is distributed at first concentration and a second distribution region in which the second conductivity type impurity is distributed at second concentration higher than the first concentration.

According to the above aspect of the present invention, since the second conductivity type region is formed of a plurality of unit cells arranged therein, each of which is a repeating unit of a distribution of a second conductivity type impurity, and each of the unit cells has at least a first distribution region in which the second conductivity type impurity is distributed at first concentration and a second distribution region in which the second conductivity type impurity is distributed at second concentration higher than the first concentration, it is possible to adjust a concentration distribution of the second conductivity type impurity by combination of the first distribution region and the second distribution region even with less number of ion implantations. Further, with such an arrangement of the plurality of unit cells, since the second conductivity type impurity is not locally distributed, it is also possible to achieve a sufficient breakdown voltage.

These and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter, with reference to figures, discussion will be made on the preferred embodiment of the present invention.

<The Preferred Embodiment>
<Structure>

Figure 1:
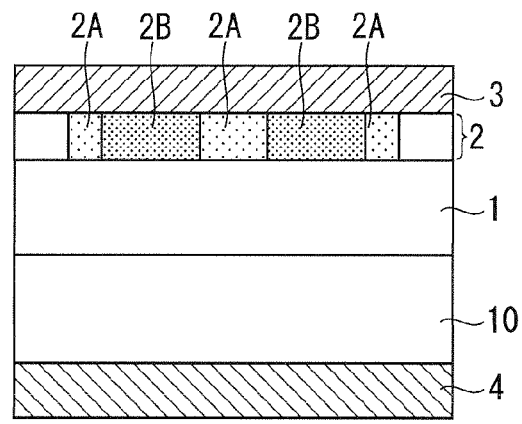
FIG. 1 is a cross section showing a structure of a silicon carbide semiconductor device in accordance with a preferred embodiment of the present invention.

FIG. 1 is a cross section showing a structure of a silicon carbide semiconductor device in accordance with the preferred embodiment of the present invention. Though a JBS or an MPS using silicon carbide will be shown as an example in this preferred embodiment, the silicon carbide semiconductor device of the present invention is not limited to these structures but may be an SBD, a MOSFET, or the like.

As shown in FIG. 1, the silicon carbide semiconductor device comprises an $N^-$, -type (first conductivity type) silicon carbide drift layer 1 formed on an $N^+$, -type (first conductivity type) silicon carbide substrate 10 by epitaxial growth, a P-type region 2 which is a second conductivity type region formed in a surface layer of the silicon carbide drift layer 1, a Schottky electrode 3 formed above the silicon carbide drift layer 1 correspondingly to a forming portion of the P-type region 2 (so as to have the P-type region 2 disposed therebelow in FIG. 1), and an ohmic electrode 4 formed on a back surface of the silicon carbide substrate 10. On the Schottky electrode 3, an Al pad (not shown) of about 5 μm may be formed as a pad for wire bonding (WB).

Figure 2A:
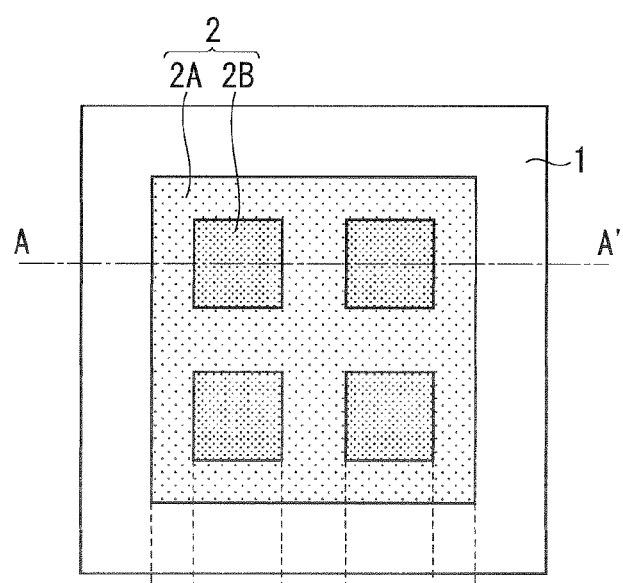
FIG. 2A is a plan view showing the silicon carbide semiconductor device in accordance with the preferred embodiment of the present invention.
Figure 2B:
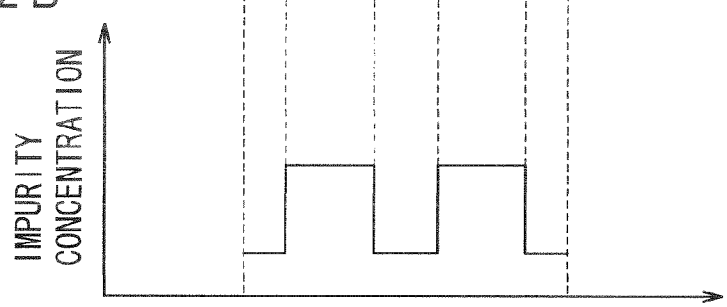
FIG. 2B is a distribution chart of impurity concentration.

FIG. 2A is a plan view showing the silicon carbide semiconductor device shown in FIG. 1, and FIG. 2B is a distribution chart of P-type impurity concentration in a cross section taken along the A-A' line of the plan view. For simple illustration, however, the Schottky electrode 3 is not shown.

As shown in FIG. 2A, the P-type region 2 consists of a low-concentration P-type region 2A and a high-concentration P-type region 2B. The arrangement of the low-concentration P-type region 2A and the high-concentration P-type region 2B, however, is not limited to that shown in FIG. 2A and various other arrangements may be adopted. The kinds of the P-type regions are not limited to the two kinds (the low-concentration P-type region 2A and the high-concentration P-type region 2B) shown in FIG. 2A, and a P-type region of different concentration (not shown) may be further formed (discussed in detail later).

The low-concentration P-type region 2A and the high-concentration P-type region 2B are regions which are implanted with P-type (the second conductivity type) impurity ions, and as shown in FIG. 2B, the P-type impurity concentration of the high-concentration P-type region 2B is set higher than that of the low-concentration P-type region 2A (see the vertical axis).

Figure 3:
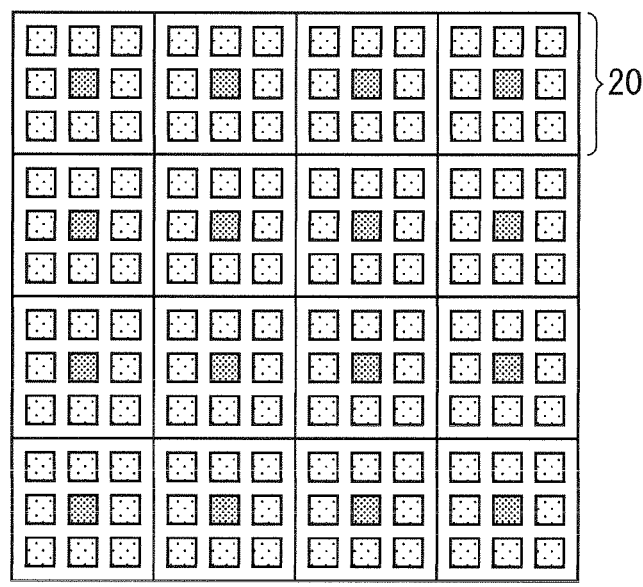
FIG. 3 is a view illustrating in detail a low-concentration P-type region of the silicon carbide semiconductor device in accordance with the preferred embodiment of the present invention.

FIG. 3 is a view illustrating the low-concentration P-type region 2A in detail. As shown in FIG. 3, the low-concentration P-type region 2A is formed of a plurality of unit cells 20 arranged therein, each of which is a repeating unit of a distribution of a P-type impurity. Further, in the low-concentration P-type region 2A, the occupied area (size) and the shape of each unit cell 20 may be uniform or may not be uniform.

Figure 4:
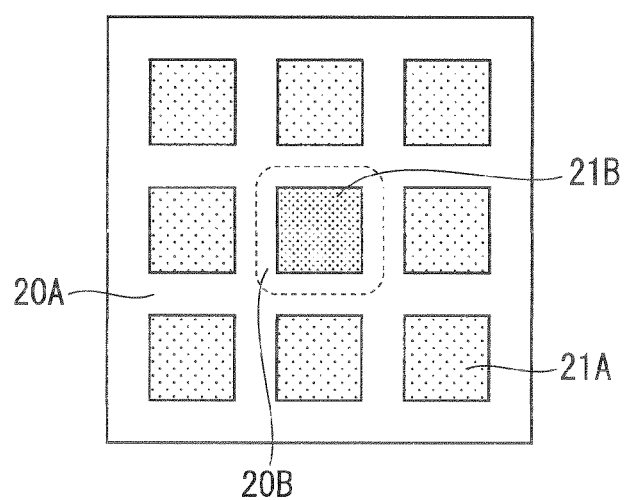
FIG. 4 is a view illustrating an inside of each unit cell of the silicon carbide semiconductor device in accordance with the preferred embodiment of the present invention.

FIG. 4 is a view illustrating an inside of each of the unit cells 20 shown in FIG. 3. As shown in FIG. 4, in each unit cell 20, arranged are unit distribution regions 21A each of which is implanted with a low concentration (first concentration) P-type impurity and a unit distribution region 21B which is implanted with a high concentration (second concentration higher than the first concentration) P-type impurity, being separated from one another. Further, in each unit cell 20, the occupied area (size) and the shape of each unit distribution region may be uniform or may not be uniform.

Assuming that the group of the unit distribution regions 21A (eight unit distribution regions 21A in FIG. 4) is a first distribution region 20A and the group of the unit distribution region(s) 21B (only one unit distribution region 21B in FIG. 4) is a second distribution region 20B, it can be seen that the unit cell 20 consists of the two kinds of distribution regions having different P-type impurity concentrations, i.e., the first distribution region 20A and the second distribution region 20B.

Herein, each distribution region (of the first distribution region 20A and the second distribution region 20B) is not limited to one consisting of unit distribution regions being separated from one another as shown in FIG. 4 but may be one having a continuous distribution region. Further, the first concentration of the first distribution region 20A may be 0.

Figure 5:
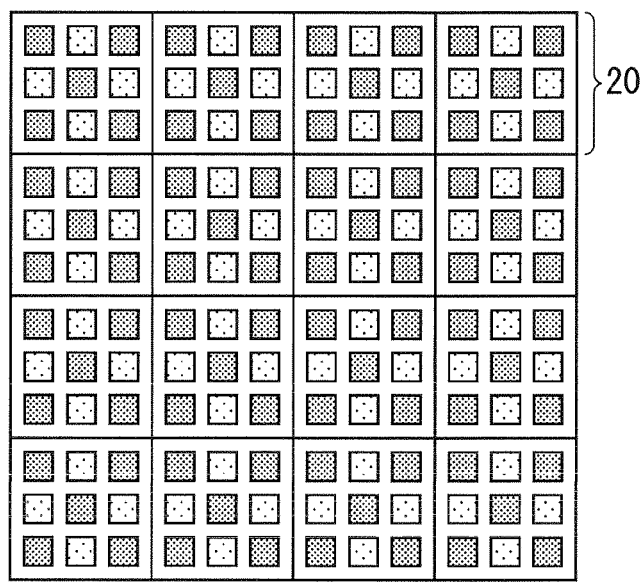
FIG. 5 is a view illustrating in detail a high-concentration P-type region of the silicon carbide semiconductor device in accordance with the preferred embodiment of the present invention.

FIG. 5 is a view illustrating the high-concentration P-type region 2B in detail. As shown in FIG. 5, the high-concentration P-type region 2B is formed of a plurality of unit cells 20 arranged therein, each of which is a repeating unit of the distribution of the P-type impurity. Though the unit cells 20 in the high-concentration P-type region 2B each have the same occupied area and shape as those of the unit cells 20 in the low-concentration P-type region 2A in FIG. 5, the unit cells 20 in the high-concentration P-type region 2B may each have different occupied area and shape as those of the unit cells 20 in the low-concentration P-type region 2A, and in the high-concentration P-type region 2B, the occupied area (size) and the shape of each unit cell 20 may be uniform or may not be uniform.

Figure 6:
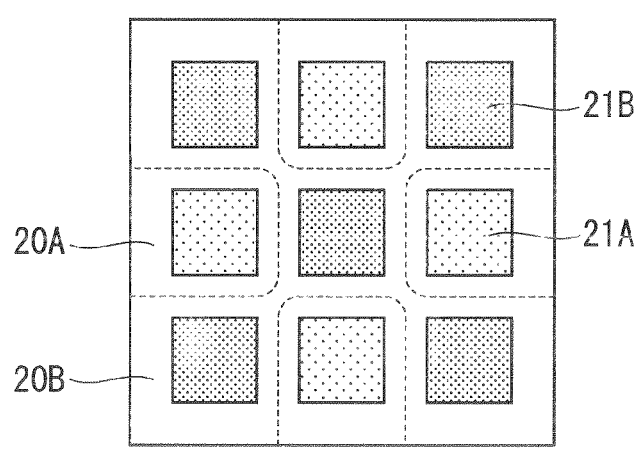
FIG. 6 is a view illustrating an inside of each unit cell of the silicon carbide semiconductor device in accordance with the preferred embodiment of the present invention.

FIG. 6 is a view illustrating an inside of each of the unit cells 20 shown in FIG. 5. As shown in FIG. 6, in each unit cell 20, arranged are unit distribution regions 21A each of which is implanted with a low concentration P-type impurity and unit distribution regions 21B each of which is implanted with a high concentration P-type impurity, being separated from one another. Further, in each unit cell 20, the occupied area (size) and the shape of each unit distribution region may be uniform or may not be uniform.

Assuming that the group of the unit distribution regions 21A (four unit distribution regions 21A in FIG. 6) is a first distribution region 20A and the group of the unit distribution regions 21B (five unit distribution regions 21B in FIG. 6) is a second distribution region 20B, it can be seen that the unit cell 20 consists of the two kinds of distribution regions having different P-type impurity concentrations, i.e., the first distribution region 20A and the second distribution region 20B.

Herein, each distribution region (of the first distribution region 20A and the second distribution region 20B) is not limited to one consisting of unit distribution regions being separated from one another as shown in FIG. 6 but may be one having a continuous distribution region.

The occupied area of the second distribution region 20B in each unit cell 20 included in the high-concentration P-type region 2B is larger than that in the low-concentration P-type region 2A. In other words, the occupied ratio of the second distribution region 20B in each unit cell 20 included in the high-concentration P-type region 2B is higher than that in the low-concentration P-type region 2A. As a result, the occupied ratio of the second distribution regions 20B in the whole of the high-concentration P-type region 2B is also higher than that in the whole of the low-concentration P-type region 2A, and the P-type impurity concentration of the whole of the high-concentration P-type region 2B can be artificially made higher. By changing the occupied ratio of the second distribution regions 20B (or the first distribution regions 20A) in the unit cells 20 in accordance with the forming portion in the surface layer of the silicon carbide drift layer 1, it is possible to artificially change the P-type impurity concentration in the whole of the high-concentration P-type region 2B (or the low-concentration P-type region 2A).

The unit cells 20 included in the high-concentration P-type region 2B and the unit cells 20 included in the low-concentration P-type region 2A in which the distribution regions (the first distribution regions 20A and the second distribution regions 20B) included therein can be arbitrarily set can form an effective region on the silicon carbide substrate 10.

Figure 7A:
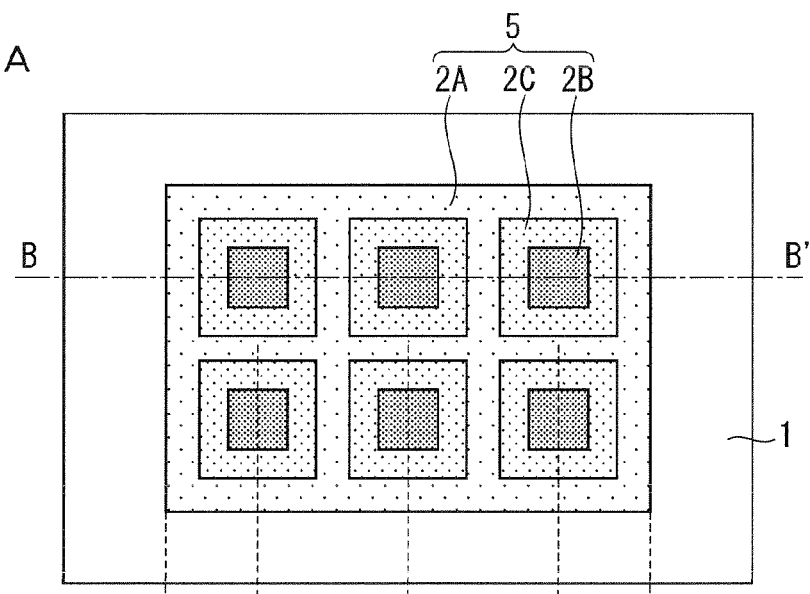
FIG. 7A is a plan view showing the silicon carbide semiconductor device in accordance with the preferred embodiment of the present invention.
Figure 7B:
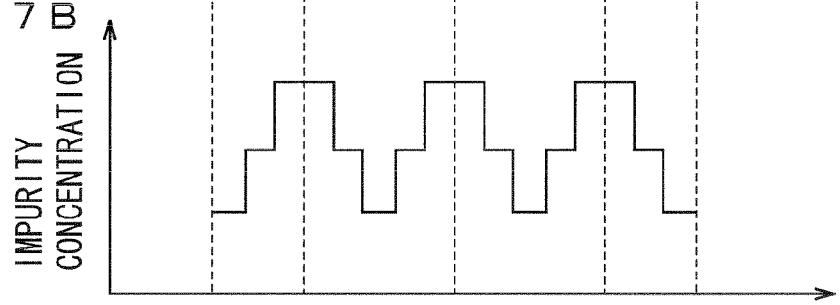
FIG. 7B is a distribution chart of impurity concentration.

FIG. 7A is a plan view showing the silicon carbide semiconductor device in accordance with the present preferred embodiment, and FIG. 7B is a distribution chart of P-type impurity concentration in a cross section taken along the B-B' line of the plan view. For simple illustration, however, the Schottky electrode 3 is not shown.

As shown in FIG. 7A, a P-type region 5 consists of a low-concentration P-type region 2A, a high-concentration P-type region 2B, and an intermediate concentration P-type region 2C. The arrangement of the low-concentration P-type region 2A, the high-concentration P-type region 2B, and the intermediate concentration P-type region 2C, however, is not limited to that shown in FIG. 7A and various other arrangements may be adopted.

As shown in FIG. 7B, the P-type impurity concentration of the intermediate concentration P-type region 2C is set higher than that of the low-concentration P-type region 2A (see the vertical axis) and set lower than that of the high-concentration P-type region 2B (see the vertical axis).

Figure 8:
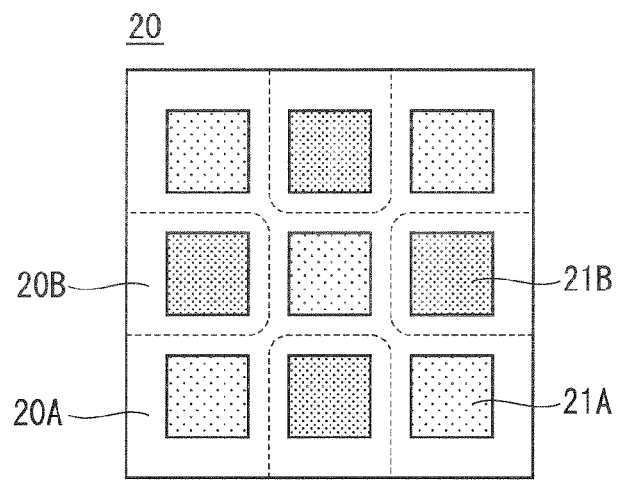
FIGS. 8 to 22 are views each illustrating an inside of each unit cell of the silicon carbide semiconductor device in accordance with the preferred embodiment of the present invention.

FIG. 8 is a view illustrating an inside of each of unit cells 20 in the intermediate concentration P-type region 2C shown in FIG. 7A. As shown in FIG. 8, in each of the unit cells 20, arranged are unit distribution regions 21A each of which is implanted with a low concentration P-type impurity and unit distribution regions 21B each of which is implanted with a high concentration P-type impurity, being separated from one another.

Assuming that the group of the unit distribution regions 21A (five unit distribution regions 21A in FIG. 8) is a first distribution region 20A and the group of the unit distribution regions 21B (four unit distribution regions 21B in FIG. 8) is a second distribution region 20B, it can be seen that the unit cell 20 consists of the two kinds of distribution regions having different P-type impurity concentrations, i.e., the first distribution region 20A and the second distribution region 20B.

Herein, each distribution region (of the first distribution region 20A and the second distribution region 20B) is not limited to one consisting of unit distribution regions being separated from one another as shown in FIG. 8 but may be one having a continuous distribution region.

The occupied area of the second distribution region 20B in each unit cell 20 included in the intermediate concentration P-type region 2C is larger than that in the low-concentration P-type region 2A and smaller than that in the high-concentration P-type region 2B. In other words, the occupied ratio of the second distribution region 20B in each unit cell 20 included in the intermediate concentration P-type region 2C is higher than that in the low-concentration P-type region 2A and lower than in the high-concentration P-type region 2B. As a result, the occupied ratio of the second distribution regions 20B in the whole of the intermediate concentration P-type region 2C is also higher than that in the whole of the low-concentration P-type region 2A and also lower than in the whole of the high-concentration P-type region 2B, and the P-type impurity concentration of the whole of the intermediate concentration P-type region 2C can be artificially made higher than that of the whole of the low-concentration P-type region 2A and lower than that of the whole of the high-concentration P-type region 2B.

Thus, by forming the intermediate concentration P-type region 2C between the distribution region in the low-concentration P-type region 2A and the distribution region in the high-concentration P-type region 2B, the change in the impurity distribution concentration from the low-concentration P-type region 2A to the high-concentration P-type region 2B becomes gentler and more continuous change in the impurity concentration can be achieved. Such a more continuous change in the impurity concentration can be achieved by increasing the number of combination patterns in the occupied ratio between the first distribution region 20A and the second distribution region 20B in each unit cell 20 and arranging the unit cells 20 in such an order that the P-type impurity concentration gradually changes.

In FIGS. 2A and 7A, though the high-concentration P-type region 2B is formed at a predetermined portion, the forming portion may be a center portion of the surface layer of the silicon carbide drift layer 1, a wire bond portion thereof, or a power supply connection portion thereof.

Next, other examples of the inside of each unit cell 20 will be shown (see FIGS. 9 to 22).

Figure 9:
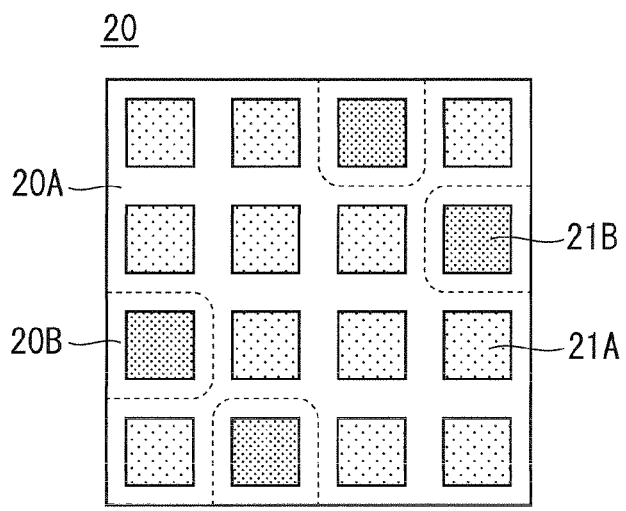

In FIG. 9, in each unit cell 20, four unit distribution regions in a vertical direction and four unit distribution regions in a horizontal direction are arranged, being separated from one another. In FIG. 9, it can be seen that the unit cell 20 consists of the two kinds of distribution regions having different P-type impurity concentrations, i.e., the first distribution region 20A consisting of a group of twelve unit distribution regions 21A and the second distribution region 20B consisting of a group of four unit distribution regions 21B.

Figure 10:
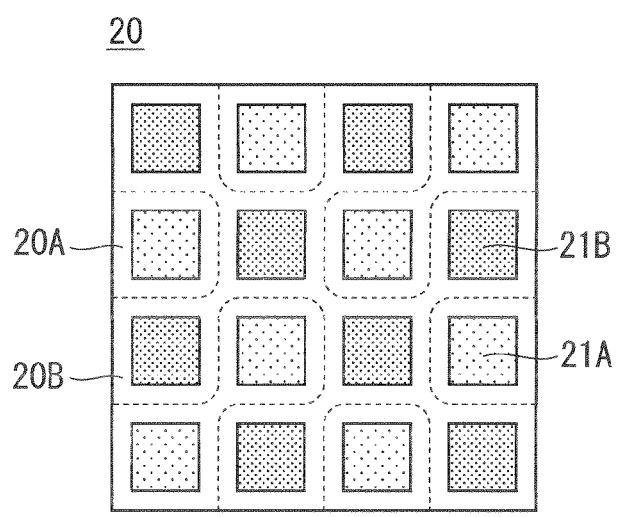

In FIG. 10, in each unit cell 20, four unit distribution regions in the vertical direction and four unit distribution regions in the horizontal direction are arranged, being separated from one another. In FIG. 10, it can be seen that the unit cell 20 consists of the two kinds of distribution regions having different P-type impurity concentrations, i.e., the first distribution region 20A consisting of a group of eight unit distribution regions 21A and the second distribution region 20B consisting of a group of eight unit distribution regions 21B.

Figure 11:
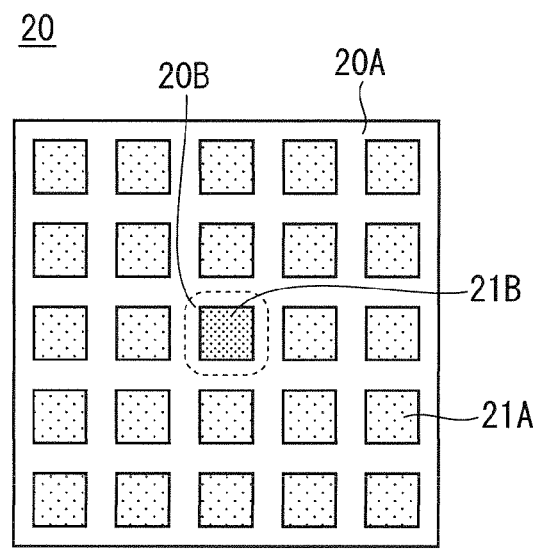

In FIG. 11, in each unit cell 20, five unit distribution regions in the vertical direction and five unit distribution regions in the horizontal direction are arranged, being separated from one another. In FIG. 11, it can be seen that the unit cell 20 consists of the two kinds of distribution regions having different P-type impurity concentrations, i.e., the first distribution region 20A consisting of a group of twenty-four unit distribution regions 21A and the second distribution region 20B consisting of a group of one unit distribution region 21B (only the center portion).

Figure 12:
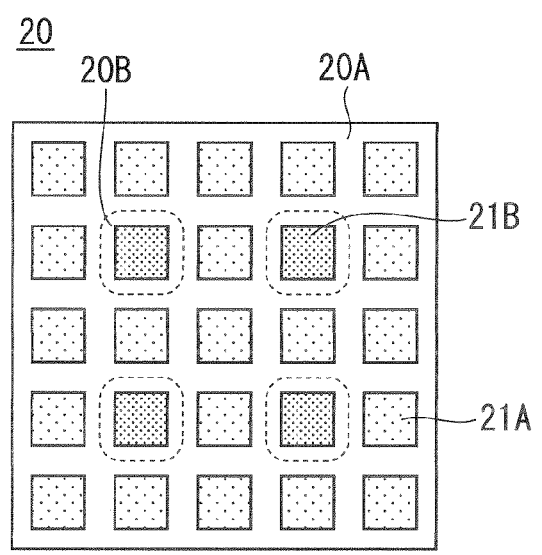

In FIG. 12, in each unit cell 20, five unit distribution regions in the vertical direction and five unit distribution regions in the horizontal direction are arranged, being separated from one another. In FIG. 12, it can be seen that the unit cell 20 consists of the two kinds of distribution regions having different P-type impurity concentrations, i.e., the first distribution region 20A consisting of a group of twenty-one unit distribution regions 21A and the second distribution region 20B consisting of a group of four unit distribution regions 21B.

Figure 13:
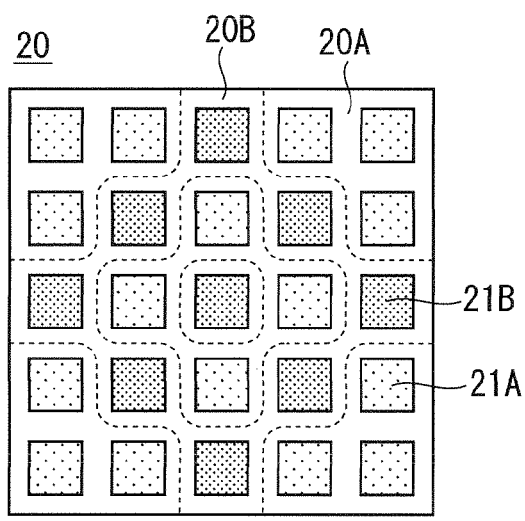

In FIG. 13, in each unit cell 20, five unit distribution regions in the vertical direction and five unit distribution regions in the horizontal direction are arranged, being separated from one another. In FIG. 13, it can be seen that the unit cell 20 consists of the two kinds of distribution regions having different P-type impurity concentrations, i.e., the first distribution region 20A consisting of a group of sixteen unit distribution regions 21A and the second distribution region 20B consisting of a group of nine unit distribution regions 21B.

Figure 14:
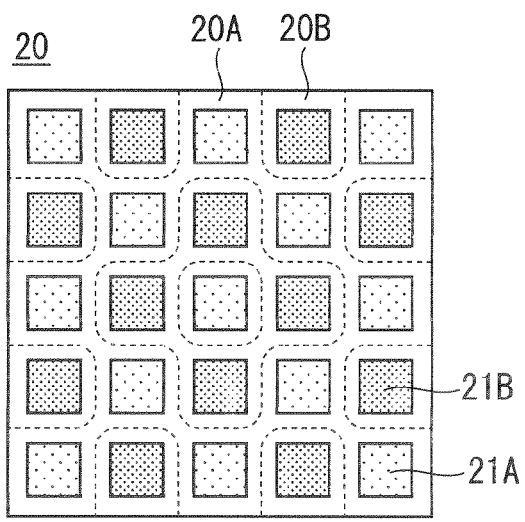

In FIG. 14, in each unit cell 20, five unit distribution regions in the vertical direction and five unit distribution regions in the horizontal direction are arranged, being separated from one another. In FIG. 14, it can be seen that the unit cell 20 consists of the two kinds of distribution regions having different P-type impurity concentrations, i.e., the first distribution region 20A consisting of a group of thirteen unit distribution regions 21A and the second distribution region 20B consisting of a group of twelve unit distribution regions 21B.

Figure 15:
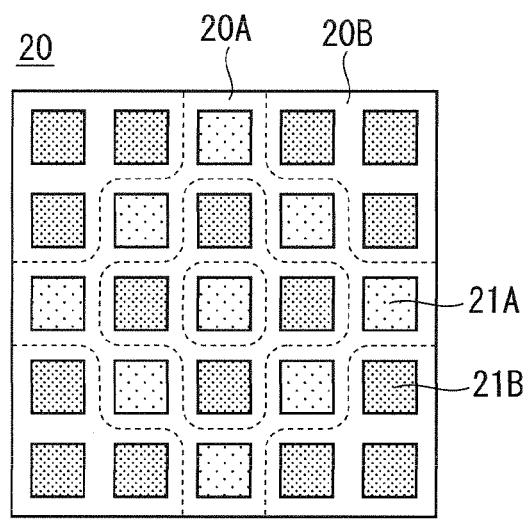

In FIG. 15, in each unit cell 20, five unit distribution regions in the vertical direction and five unit distribution regions in the horizontal direction are arranged, being separated from one another. In FIG. 15, it can be seen that the unit cell 20 consists of the two kinds of distribution regions having different P-type impurity concentrations, i.e., the first distribution region 20A consisting of a group of nine unit distribution regions 21A and the second distribution region 20B consisting of a group of sixteen unit distribution regions 21B.

Figure 16:
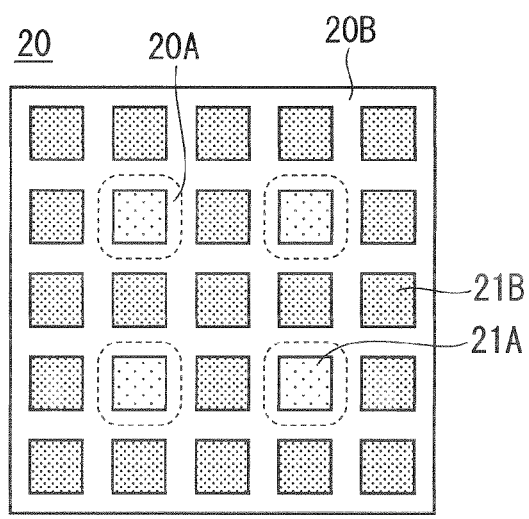

In FIG. 16, in each unit cell 20, five unit distribution regions in the vertical direction and five unit distribution regions in the horizontal direction are arranged, being separated from one another. In FIG. 16, it can be seen that the unit cell 20 consists of the two kinds of distribution regions having different P-type impurity concentrations, i.e., the first distribution region 20A consisting of a group of four unit distribution regions 21A and the second distribution region 20B consisting of a group of twenty-one unit distribution regions 21B.

Figure 17:
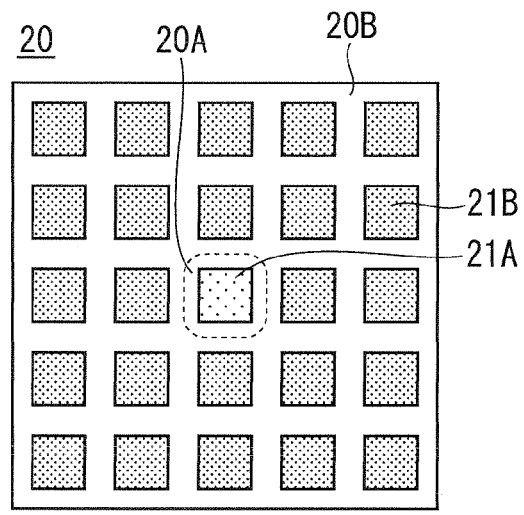

In FIG. 17, in each unit cell 20, five unit distribution regions in the vertical direction and five unit distribution regions in the horizontal direction are arranged, being separated from one another. In FIG. 17, it can be seen that the unit cell 20 consists of the two kinds of distribution regions having different P-type impurity concentrations, i.e., the first distribution region 20A consisting of a group of one unit distribution region 21A (only the center portion) and the second distribution region 20B consisting of a group of twenty-four unit distribution regions 21B.

Figure 18:
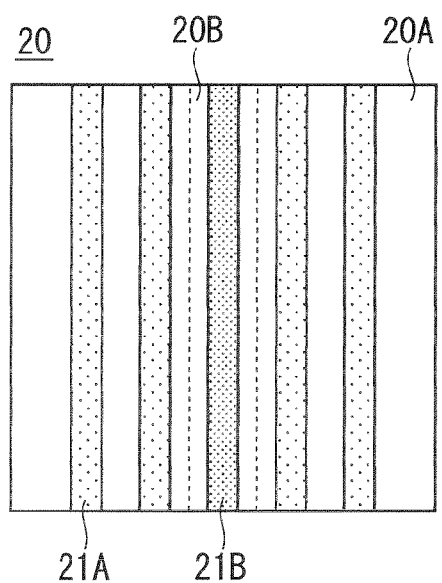

In FIG. 18, in each unit cell 20, strip-like unit distribution regions are arranged, being separated from one another. In FIG. 18, it can be seen that the unit cell 20 consists of the two kinds of distribution regions having different P-type impurity concentrations, i.e., the first distribution region 20A consisting of a group of four unit distribution regions 21A and the second distribution region 20B consisting of a group of one unit distribution region 21B (only the center portion). The P-type impurity concentration can be adjusted by fixing the distance between the unit distribution regions and changing the number of strips of the unit distribution regions.

Figure 19:
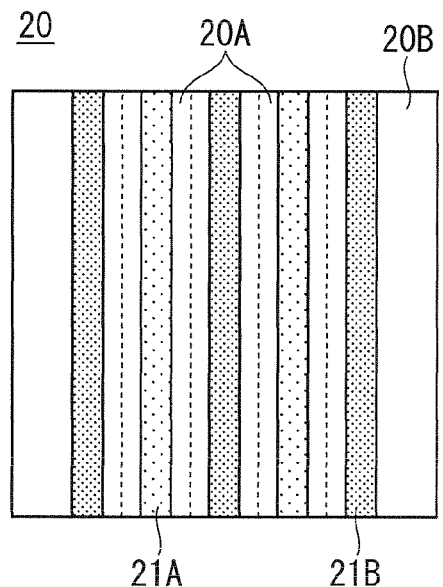

In FIG. 19, in each unit cell 20, strip-like unit distribution regions are arranged, being separated from one another. In FIG. 19, it can be seen that the unit cell 20 consists of the two kinds of distribution regions having different P-type impurity concentrations, i.e., the first distribution region 20A consisting of a group of two unit distribution regions 21A and the second distribution region 20B consisting of a group of three unit distribution regions 21B. The P-type impurity concentration can be adjusted by fixing the distance between the unit distribution regions and changing the number of strips of the unit distribution regions.

Figure 20:
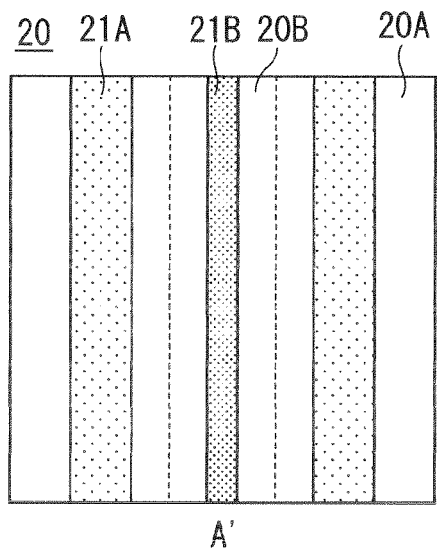

In FIG. 20, in each unit cell 20, strip-like unit distribution regions are arranged, being separated from one another. In FIG. 20, it can be seen that the unit cell 20 consists of the two kinds of distribution regions having different P-type impurity concentrations, i.e., the first distribution region 20A consisting of a group of two unit distribution regions 21A and the second distribution region 20B consisting of a group of one unit distribution region 21B (only the center portion). Further, in FIG. 20, the unit distribution regions are formed so that the width of the strip of the unit distribution region 21B is narrower than that of the strip of the unit distribution region 21A. The P-type impurity concentration can be adjusted by making the distance between the unit distribution regions variable and changing the occupied area of the unit distribution region.

Figure 21:
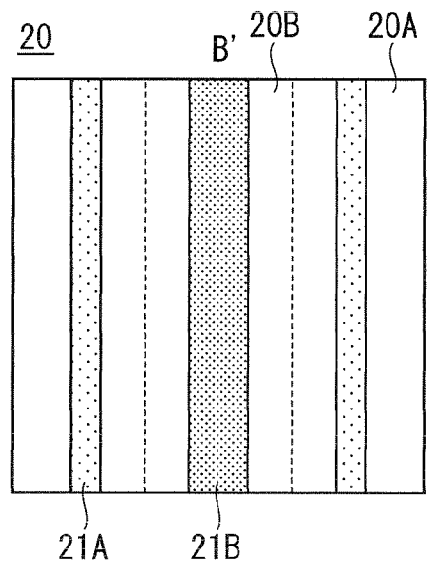

In FIG. 21, in each unit cell 20, strip-like unit distribution regions are arranged, being separated from one another. In FIG. 21, it can be seen that the unit cell 20 consists of the two kinds of distribution regions having different P-type impurity concentrations, i.e., the first distribution region 20A consisting of a group of two unit distribution regions 21A and the second distribution region 20B consisting of a group of one unit distribution region 21B (only the center portion). Further, in FIG. 21, the unit distribution regions are formed so that the width of the strip of the unit distribution region 21B is wider than that of the strip of the unit distribution region 21A.

Figure 22:
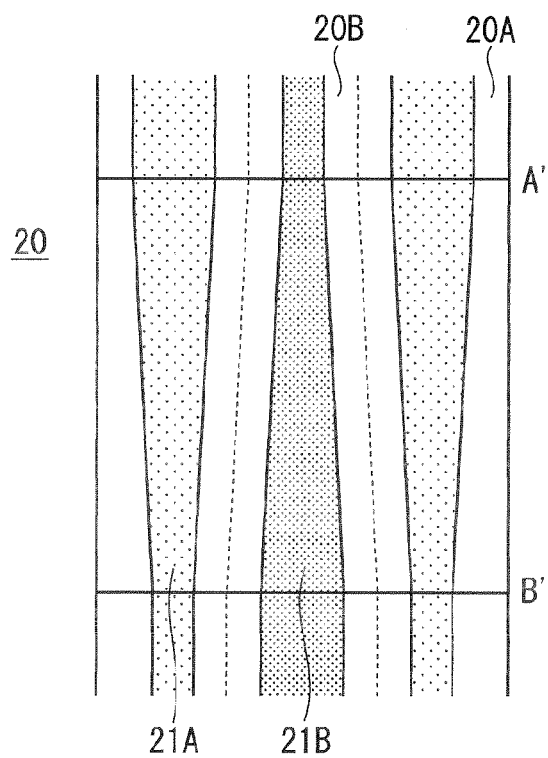

In FIG. 22, in each unit cell 20, strip-like unit distribution regions are arranged, being separated from one another. In FIG. 22, it can be seen that the unit cell 20 consists of the two kinds of distribution regions having different P-type impurity concentrations, i.e., the first distribution region 20A consisting of a group of two unit distribution regions 21A and the second distribution region 20B consisting of a group of one unit distribution region 21B (only the center portion). Further, in FIG. 22, the unit distribution regions are formed so that the width of the strip of the unit distribution region 21A becomes wider as it goes up in this figure and the width of the strip of the unit distribution region 21B becomes wider as it goes down in this figure. With such a formation, these distribution regions can be used to smoothly connect the lower portion (A') of the unit cell 20 in FIG. 20 and the upper portion (B') of the unit cell 20 in FIG. 21.

<Manufacturing Method>

Discussion will be made below on a method of manufacturing the silicon carbide semiconductor device shown in FIG. 1.

First, the silicon carbide drift layer 1 is formed on the silicon carbide substrate 10 by epitaxial growth. Next, a mask such as a resist, an oxide film, or the like is formed on the silicon carbide drift layer 1.

Ion implantation is performed on the silicon carbide drift layer 1 by using the mask, to thereby form the P-type region 2 in the surface layer of the silicon carbide drift layer 1.

At that time, the ion implantation is performed two times or more with an acceleration voltage for implanting ions and the mask changed every time so that a region (hereinafter, a P+, region) of high P concentration and a region (hereinafter, a P−, region) of low P concentration may be formed as shown in FIG. 2.

Finally, the Schottky electrode 3 is formed above the silicon carbide drift layer 1, to thereby complete the silicon carbide semiconductor device (JBS or MPS).

<Operation>

Next, discussion will be made on an operation of the silicon carbide semiconductor device in accordance with the preferred embodiment of the present invention.

Figure 23A:
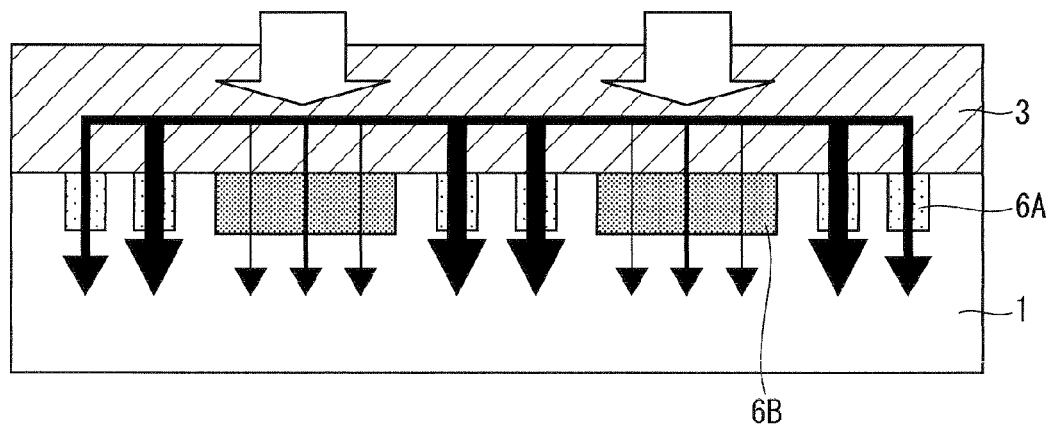
FIGS. 23A and 23B are views each showing a current path of surge current in a semiconductor device which is an underlying technique of the present invention.
Figure 23B:
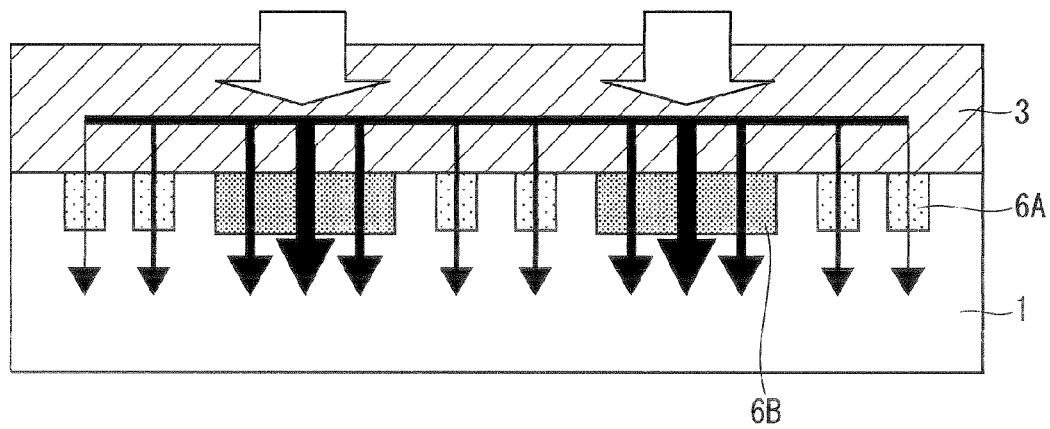

FIGS. 23A and 23B are views each showing a current path of surge current in a semiconductor device which is an underlying technique of the present invention.

A semiconductor device shown in FIGS. 23A and 23B comprises an N−, -type (first conductivity type) silicon carbide drift layer 1 formed on an N+, -type (first conductivity type) silicon carbide substrate (not shown) by epitaxial growth, a high-concentration P-type region 6B formed in a surface layer of the silicon carbide drift layer 1, a low-concentration P-type region 6A which is so formed in the surface layer of the silicon carbide drift layer 1 as to surround the high-concentration P-type region 6B in a plan view and be separated from the high-concentration P-type region 6B, a Schottky electrode 3 formed on the silicon carbide drift layer 1, and an ohmic electrode (not shown) formed on a back surface of the silicon carbide substrate 10.

Since the distance between a portion where the low-concentration P-type region 6A is formed and a portion where the high-concentration P-type region 6B is formed is relatively long in the semiconductor device shown in FIGS. 23A and 23B, there arises a difference between a wire resistance and an inductance of the semiconductor element and it is impossible to carry a surge current through the whole of the device. In other words, as shown in FIGS. 23A and 23B, the surge current is locally concentrated and sufficient breakdown voltage cannot be achieved.

Figure 24:
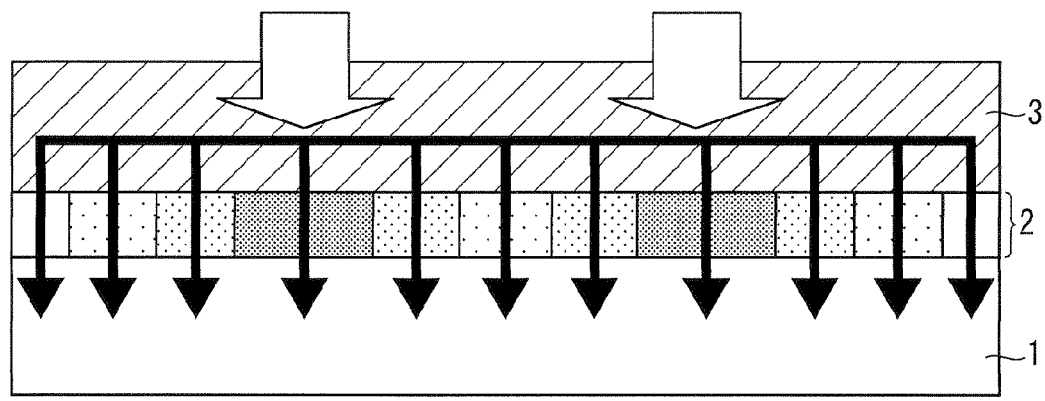
FIG. 24 is a view showing a current path of surge current in the silicon carbide semiconductor device in accordance with the preferred embodiment of the present invention.

On the other hand, in the silicon carbide semiconductor device of the present invention, as shown in FIG. 24, since the concentration distribution of the P-type impurity can be continuously changed by changing the occupied ratio between the first distribution region 20A and the second distribution region 20B in each unit cell 20, it becomes easier to uniformly carry the surge current. Therefore, it is possible to suppress local concentration of the surge current and achieve sufficient breakdown voltage.

FIGS. 25 to 28 are graphs each showing performances of the silicon carbide semiconductor device in accordance with the present invention.

Figure 25:
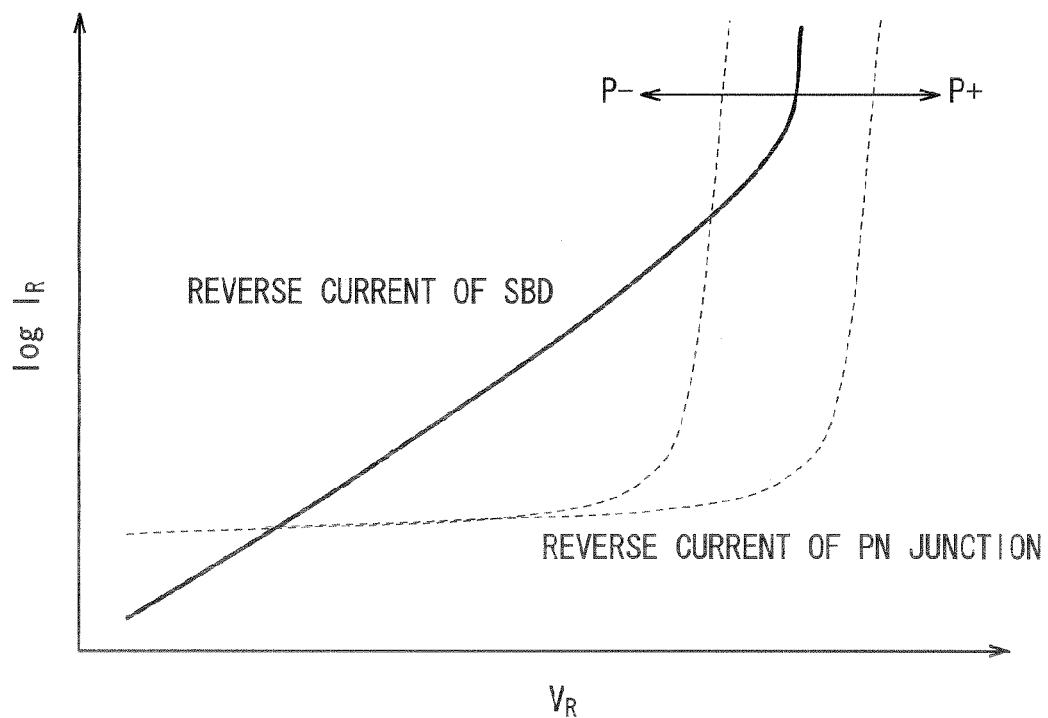
FIGS. 25 to 28 are graphs each showing performances of the silicon carbide semiconductor device in accordance with the preferred embodiment of the present invention.

FIG. 25 is a graph showing a relation between a reverse current (solid line) of a Schottky barrier diode (SBD) and a reverse current (dotted line) of a PN junction. In FIG. 25, the vertical axis represents log (reverse current $I_R$) and the horizontal axis represents a reverse voltage $V_R$.

As shown in FIG. 25, by combining the first distribution region 20A and the second distribution region 20B, the high-concentration P-type region 2B (the dotted line on the P+, side) of high P-type impurity concentration and the low-concentration P-type region 2A (the dotted line on the P−, side) of low P-type impurity concentration are artificially formed and this improves the reverse characteristics of the Schottky barrier diode (SBD) (the solid line).

Figure 26:
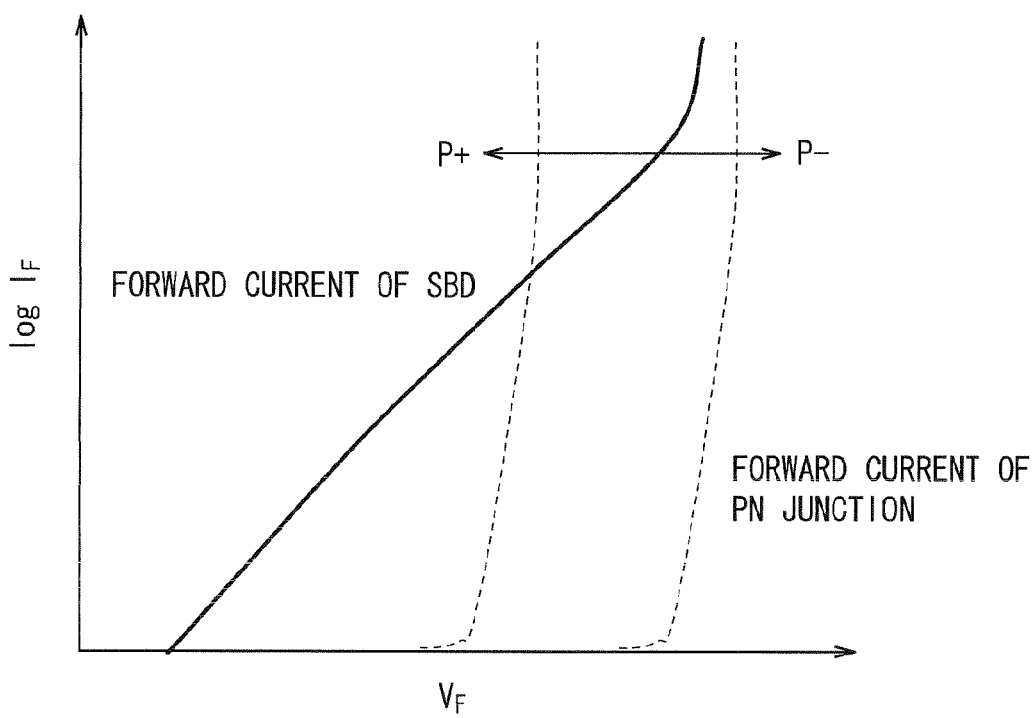

FIG. 26 is a graph showing a relation between a forward current (solid line) of the Schottky barrier diode (SBD) and a forward current (dotted line) of the PN junction. In FIG. 26, the vertical axis represents the log (forward current $I_F$) and the horizontal axis represents a forward voltage $V_F$.

As shown in FIG. 26, by combining the first distribution region 20A and the second distribution region 20B, the high-concentration P-type region 2B (the dotted line on the P+, side) of high P-type impurity concentration and the low-concentration P-type region 2A (the dotted line on the P−, side) of low P-type impurity concentration are artificially formed and this improves the forward characteristics of the Schottky barrier diode (SBD) (the solid line).

Figure 27:
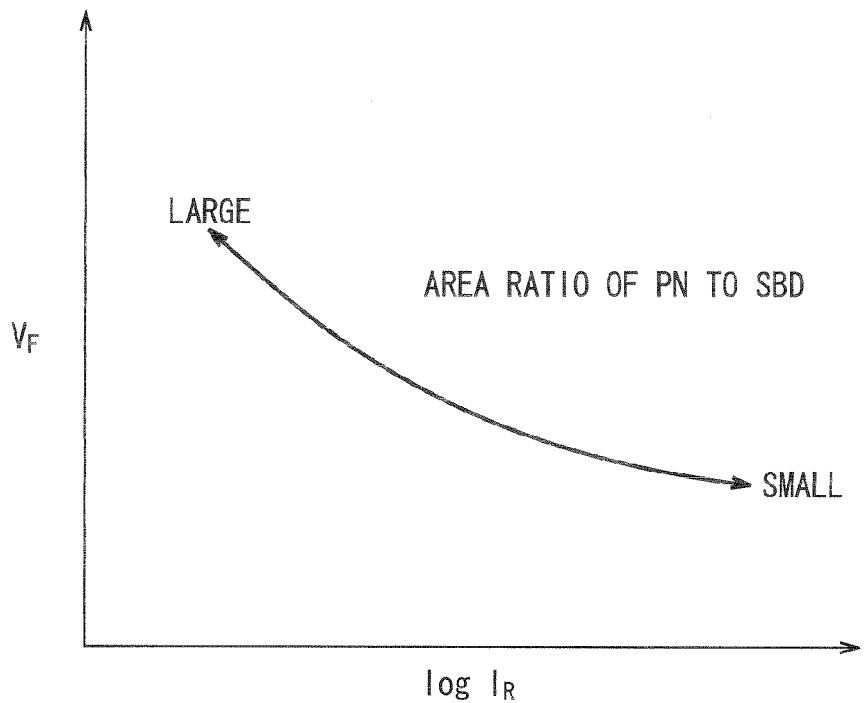
Figure 28:
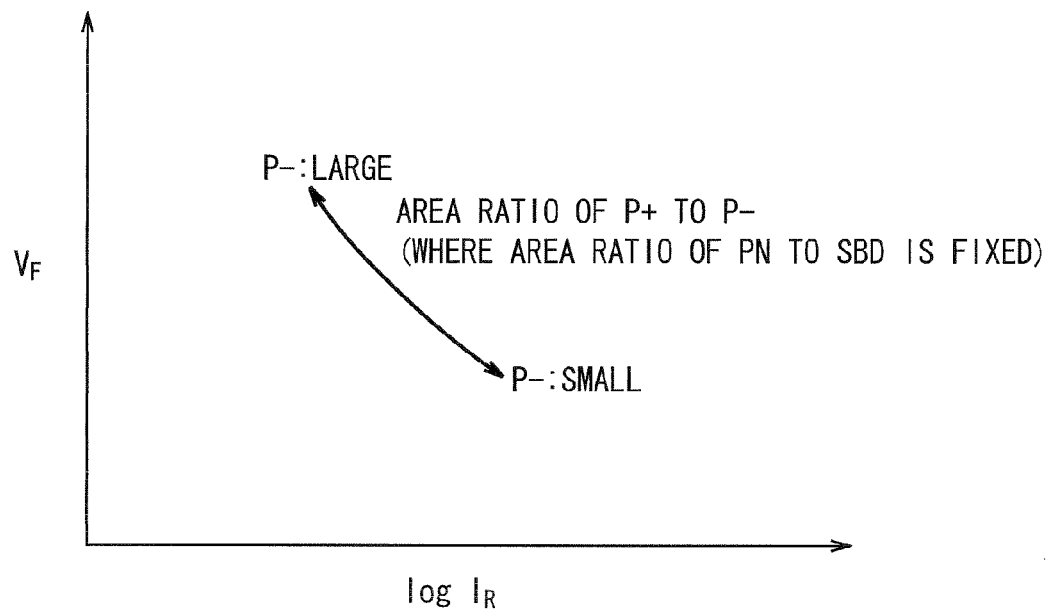

FIGS. 27 and 28 are graphs each showing a relation between a forward voltage $V_F$ and a reverse current $I_R$, in a case where an area ratio of the PN junction to the Schottky junction in the Schottky barrier diode (SBD) is changed. In FIGS. 27 and 28, the vertical axis represents the forward voltage $V_F$, and the horizontal axis represents the log (reverse current $I_R$).

As shown in FIG. 27, it can be seen that the ratio of the area of the PN junction to the area of the Schottky barrier diode (SBD) becomes smaller when the log (reverse current $I_R$) becomes larger and the ratio of the area of the PN junction to the area of the Schottky barrier diode (SBD) becomes larger when the forward voltage $V_F$, becomes larger. In the silicon carbide semiconductor device of the present invention, by changing the occupied ratio between the first distribution region 20A and the second distribution region 20B, it is possible to achieve arbitrary characteristics along the graph.

Further, when the ratio of the area of the PN junction to the area of the Schottky barrier diode (SBD) is fixed, as shown in FIG. 28, it can be seen that the ratio of the area of the high-concentration P-type region 2B to the area of the low-concentration P-type region 2A becomes larger (in other words, the area of the low-concentration P-type region 2A becomes relatively small) when the log (reverse current $I_R$) becomes larger and the ratio of the area of the high-concentration P-type region 2B to the area of the low-concentration P-type region 2A becomes smaller (in other words, the area of the low-concentration P-type region 2A becomes relatively large) when the forward voltage $V_F$, becomes larger. In the silicon carbide semiconductor device of the present invention, by changing the occupied ratio between the first distribution region 20A and the second distribution region 20B, it is possible to achieve arbitrary characteristics along the graph.

<Variations>

Figure 29:
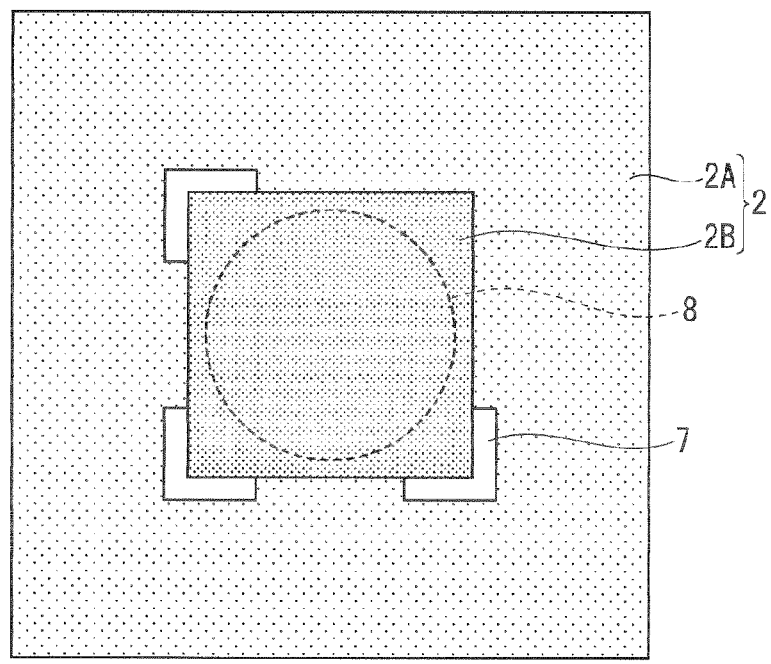
FIG. 29 is a plan view showing a silicon carbide semiconductor device in accordance with a variation of the preferred embodiment of the present invention.

FIG. 29 is a plan view showing a silicon carbide semiconductor device in accordance with a variation of the preferred embodiment of the present invention.

A P-type region 2 shown in FIG. 29 is formed of a low-concentration P-type region 2A and a high-concentration P-type region 2B.

In a case where a wire bond position 8 at which wire bonding is performed through the Schottky electrode 3 (not shown in FIG. 29) is set at a predetermined position on the high-concentration P-type region 2B, in order to accurately recognize the position, for example, two or three recognizably small slits 7 (alignment marks) may be formed at some of four corners of an Al pad (not shown in FIG. 29) formed on the Schottky electrode 3. With these slits 7 which are formed thus, it becomes possible to improve the alignment accuracy for wire bonding and suppress a decrease in the surge current capacity due to misalignment in wire bonding or the like.

<Effects>

In the preferred embodiment of the present invention, the silicon carbide semiconductor device comprises the silicon carbide drift layer 1 of a first conductivity type (N type)

formed on the silicon carbide substrate 10 of the first conductivity type, the P-type region 2 which is a second conductivity type (P type) region formed in the surface layer of the silicon carbide drift layer 1, and the Schottky electrode 3 formed above the silicon carbide drift layer 1 correspondingly to a forming portion of the P-type region 2.

Then, the P-type region 2 is formed of a plurality of unit cells 20 arranged therein, each of which is a repeating unit of the distribution of the P-type impurity. Further, each of the unit cells 20 has at least the first distribution region 20A in which the P-type impurity is distributed at first concentration and the second distribution region 20B in which the P-type impurity is distributed at second concentration higher than the first concentration.

With this structure, even less number of ion implantations, by changing the combination of the first distribution region 20A and the second distribution region 20B, it is possible to form a concentration distribution of the P-type impurity which smoothly changes in a multilevel manner. Therefore, without a large number of ion implantation processes performed with different conditions, such as the concentration of implanted ions, the implantation depth, and the like, it is possible to achieve a concentration distribution of the P-type impurity which changes in a multilevel manner.

Further, with a plurality of unit cells arranged, since the P-type impurity is not locally distributed, it is possible to achieve optimal forward characteristics and reverse characteristics. Therefore, since nonuniformity in the concentration distribution of the P-type impurity in a chip is eliminated and the entire chip can receive the surge current (the surge current can be carried more uniformly), it is possible to achieve a silicon carbide semiconductor device of high performance and high surge current capacity.

Furthermore, since the P-type impurity region is formed by laying the unit cells 20 down, it is possible to adapt to various shapes of the silicon carbide substrate 10. Though the surface shape of the silicon carbide substrate 10 is usually a square or a regular polygon, the present invention allows adaptation to a rectangle or other asymmetrical shapes.

In the preferred embodiment of the present invention, the occupied ratio between the first distribution region 20A and the second distribution region 20B in each unit cell 20 in one forming portion is different from that in each unit cell 20 in the other forming portion.

With this structure, by changing the occupied ratio between the first distribution region 20A and the second distribution region 20B, i.e., the occupied ratio between the low-concentration P-type region 2A and the high-concentration P-type region 2B depending on the forming portion, it is possible to form a concentration distribution of the P-type impurity that allows the surge current to be uniformly carried.

In the preferred embodiment of the present invention, the occupied ratio of the second distribution region 20B in each unit cell 20 is higher in a center portion of the surface layer of the silicon carbide drift layer 1 than in a peripheral portion thereof.

With this structure, since the occupied ratio of the second distribution region 20B of high surge current capacity can be made higher in the center portion of the surface layer of the silicon carbide drift layer 1 where the surge current is likely to be concentrated, the surge current can be effectively carried in the entire chip and it is thereby possible to achieve high surge current capacity.

In the preferred embodiment of the present invention, the occupied ratio of the second distribution region 20B in each unit cell 20 is higher in a wire bond portion of the surface layer of the silicon carbide drift layer 1 than in a peripheral portion thereof.

With this structure, since the occupied ratio of the second distribution region 20B of high surge current capacity can be made higher in the wire bond portion of the surface layer of the silicon carbide drift layer 1 where the surge current is likely to be concentrated, the surge current can be effectively carried in the entire chip and it is thereby possible to achieve high surge current capacity.

In the preferred embodiment of the present invention, the occupied ratio of the second distribution region 20B in each unit cell 20 is higher in a power supply connection portion of the surface layer of the silicon carbide drift layer 1 than in a peripheral portion thereof.

With this structure, since the occupied ratio of the second distribution region 20B of high surge current capacity can be made higher in the power supply connection portion of the surface layer of the silicon carbide drift layer 1 where the surge current is likely to be concentrated, the surge current can be effectively carried in the entire chip and it is thereby possible to achieve high surge current capacity.

In the preferred embodiment of the present invention, the first distribution region 20A is a distribution region which is formed of a plurality of unit distribution regions 21A arranged therein, being separated from one another and the second distribution region 20B is a distribution region which is formed of a plurality of unit distribution regions 21B arranged therein, being separated from one another, and the occupied area of each unit distribution region 21A in the first distribution region 20A and the occupied area of each unit distribution region 21B in the second distribution region 20B are equal to each other in the surface layer of the silicon carbide drift layer 1.

With this structure, it is possible to easily arrange the unit distribution regions 21A and the unit distribution regions 21B which constitute the unit cell 20 in the unit cell 20.

In the preferred embodiment of the present invention, the first distribution region 20A is a distribution region which is formed of a plurality of unit distribution regions 21A arranged therein, being separated from one another and the second distribution region 20B is a distribution region which is formed of a plurality of unit distribution regions 21B arranged therein, being separated from one another, and the occupied area of each unit distribution region 21A in the first distribution region 20A and the occupied area of each unit distribution region 21B in the second distribution region 20B are different from each other in the surface layer of the silicon carbide drift layer 1.

With this structure, by using the unit distribution regions 21A and the unit distribution regions 21B, it is possible to achieve various patterns of arrangement in the unit cell 20.

In the preferred embodiment of the present invention, the unit cells 20 in the surface layer of the silicon carbide drift layer 1 have the same occupied area.

With this structure, since the size of each unit cell 20 is uniform, it is possible to easily arrange the unit cells 20 in the surface layer of the silicon carbide drift layer 1.

In the preferred embodiment of the present invention, the unit cells 20 in the surface layer of the silicon carbide drift layer 1 have different occupied areas.

With this structure, by using the unit cells 20 of different sizes, it is possible to achieve various patterns of arrangement in the surface layer of the silicon carbide drift layer 1.

Further, in the preferred embodiment of the present invention, the Schottky electrode 3 comprises the alignment mark (slit 7) for the Schottky electrode 3.

With this structure, since the positioning accuracy for wire bonding can be improved, it is possible to reduce misalignment between the unit cells 20 and the wires and thereby maintain high surge current capacity.

Though the material properties and the materials of the constituent members, the conditions for the executions, and the like have been described in the preferred embodiment of the present invention, these are only exemplary ones and not limited to the above-described ones.

While the invention has been shown and described in detail, the foregoing description is in all aspects illustrative and not restrictive. It is therefore understood that numerous modifications and variations can be devised without departing from the scope of the invention.

What is claimed is:

1. A silicon carbide semiconductor device, comprising:
    a silicon carbide drift layer of a first conductivity type formed on a silicon carbide substrate of the first conductivity type;
    a second conductivity type region formed in a surface layer of said silicon carbide drift layer; and
    a Schottky electrode formed above said silicon carbide drift layer correspondingly to a forming portion of said second conductivity type region, wherein
    said second conductivity type region is formed of a plurality of unit cells arranged therein, each of which is a repeating unit of a distribution of a second conductivity type impurity,
    each of said plurality of unit cells has at least a first distribution region in which said second conductivity type impurity is distributed at first concentration and a second distribution region in which said second conductivity type impurity is distributed at second concentration higher than said first concentration, and
    each of said plurality of unit cells in one part of said forming portion and each of said plurality of unit cells in another part of said forming portion are different from each other in occupied ratio between said first distribution region and said second distribution region.

2. The silicon carbide semiconductor device according to claim 1, wherein
    an occupied ratio of said second distribution region in each of said plurality of unit cells is higher in a center portion of said surface layer of said silicon carbide drift layer than in a peripheral portion thereof.

3. The silicon carbide semiconductor device according to claim 1, wherein
    an occupied ratio of said second distribution region in each of said plurality of unit cells is higher in a wire bond portion of said surface layer of said silicon carbide drift layer than in a peripheral portion thereof.

4. The silicon carbide semiconductor device according to claim 1, wherein
    an occupied ratio of said second distribution region in each of said plurality of unit cells is higher in a power supply connection portion of said surface layer of said silicon carbide drift layer than in a peripheral portion thereof.

5. The silicon carbide semiconductor device according to claim 1, wherein
    said plurality of unit cells in each of which said first and second distribution regions included therein are arbitrarily set form an effective region on said silicon carbide substrate.

6. The silicon carbide semiconductor device according to claim 1, wherein
    said first distribution region and said second distribution region are each a distribution region in which a plurality of unit distribution regions separated from one another are arranged, and
    each of said unit distribution regions in said first distribution region and each of said unit distribution regions in said second distribution region have the same occupied area in said surface layer of said silicon carbide drift layer.

7. The silicon carbide semiconductor device according to claim 1, wherein
    said first distribution region and said second distribution region are each a distribution region in which a plurality of unit distribution regions separated from one another are arranged, and
    each of said unit distribution regions in said first distribution region and each of said unit distribution regions in said second distribution region have different occupied areas in said surface layer of said silicon carbide drift layer.

8. The silicon carbide semiconductor device according to claim 1, wherein
    said unit cells have the same occupied area in said surface layer of said silicon carbide drift layer.

9. The silicon carbide semiconductor device according to claim 1, wherein
    said unit cells have different occupied areas in said surface layer of said silicon carbide drift layer.

10. The silicon carbide semiconductor device according to claim 1, wherein
    an acceleration voltage for implantation of said second conductivity type impurity into said first distribution region and that of said second conductivity type impurity into said second distribution region are different from each other.

11. The silicon carbide semiconductor device according to claim 1, wherein
    said Schottky electrode comprises an alignment mark for said Schottky electrode.

* * * * *